US006146509A

United States Patent [19]
Aragon

[11] Patent Number: 6,146,509
[45] Date of Patent: Nov. 14, 2000

[54] INVERTED FIELD CIRCULAR MAGNETRON SPUTTERING DEVICE

[75] Inventor: Steven Aragon, Campbell, Calif.

[73] Assignee: SciVac, San Jose, Calif.

[21] Appl. No.: 09/330,883

[22] Filed: Jun. 11, 1999

[51] Int. Cl.[7] .................................................. C23C 14/35
[52] U.S. Cl. .................. 204/298.19; 204/298.2; 204/298.09; 204/298.08; 204/398.16; 204/298.17; 204/298.12
[58] Field of Search ............................ 204/298.2, 298.19, 204/298.09, 298.08, 298.16, 298.17, 298.12

[56] References Cited

U.S. PATENT DOCUMENTS

| | | | |
|---|---|---|---|
| 4,166,018 | 8/1979 | Chapin | 204/192 R |
| 4,180,450 | 12/1979 | Morrison, Jr. | 204/298.19 |
| 4,401,539 | 8/1983 | Abe et al. | 204/298.19 |
| 4,865,708 | 9/1989 | Welty | 204/192.12 |
| 4,865,710 | 9/1989 | Aaron et al. | 204/298.19 |
| 4,957,605 | 9/1990 | Hurwitt et al. | 204/298.17 |
| 5,071,535 | 12/1991 | Hartig et al. | 204/298.09 |
| 5,180,478 | 1/1993 | Hughes | 204/298.09 |
| 5,252,194 | 10/1993 | Demaray et al. | 204/298.2 |
| 5,262,028 | 11/1993 | Manley | 204/192.12 |
| 5,262,030 | 11/1993 | Potter | 204/298.2 |
| 5,415,754 | 5/1995 | Manley | 204/192.12 |

OTHER PUBLICATIONS

J. Wilson and R. Potter, "Performance Of A Variable–Plasma Computer–Controlled Sputtering Source", *Surface and Coatings Technology* 72(1995) pp. 196–199.

*Primary Examiner*—Nam Nguyen
*Assistant Examiner*—Daborah Chacko-Davis
*Attorney, Agent, or Firm*—Claude A.S. Hamrick; Oppenheimer Wolff & Donnelly LLP

[57] ABSTRACT

An inverted field circular planar magnetron sputtering device is described that produces coatings with a high degree of thickness uniformity on round wafer-like substrates. It is a compact source with no moving mechanical parts. DC signals applied to low power electromagnetic coils provide control of the coating thickness uniformity throughout the life of the target. AC signals applied to the coils oscillate the sputtering rings to improve target utilization and maintain a clean target surface. Utilization of target material is about 40% for both magnetic and non-magnetic target materials. The design accommodates versions for both direct and indirect water cooling.

26 Claims, 13 Drawing Sheets

INVERTED FIELD CIRCULAR MAGNETRON SPUTTERING DEVICE

BACKGROUND OF THE INVENTION

1. Field of the Invention

This invention relates generally to the field of magnetron sputtering devices, and more specifically to circular planar magnetron sputtering devices which have improved magnetic field structures and control features for the vacuum deposition of thin films of magnetic and non-magnetic materials on substrates. Products benefiting from application of this technology include but are not limited to computer memory disks, recording heads, and integrated circuits.

2. Brief Description of the Prior Art

Magnetron sputtering is a well-known vacuum coating process which utilizes an electrical glow discharge (or plasma) confined by magnetic fields to erode a material from a target and deposit that material onto the surface of a substrate. Its use in the electronics and computer industries is wide spread and includes such products as memory disks, audio tape, recording heads, integrated circuits, and photovoltaic cells to name but a few. Large-scale devices are used to deposit a variety of coatings on architectural glass, computer screens, automobile windows, and other substrates.

The earliest plasma sputtering apparatus took the form of a diode. Sputtering is done in a vacuum chamber in the presence of a small amount of an inert sputtering gas (usually argon). The planar target material to be sputtered is connected to the negative electrode of a DC power supply while the positive electrode is connected to a separate nearby anode or to the chamber itself, which can serve as an anode. The electric field developed between the target material and the anode is typically several thousand volts, and is sufficient to cause a fraction of the argon sputtering gas to be ionized to form a plasma discharge. The positive argon ions bombard the negative target dislodging additional electrons and target material atoms, which deposit on a substrate placed a small distance away. Deposition rates are low and the process is inefficient because, at the relatively high argon gas pressure needed to form the plasma discharge, the mean free path of the ions is only a small fraction of a centimeter. This means that the argon ions must undergo many collisions with other argon atoms on their way to the target, losing energy that would otherwise go into dislodging target atoms.

The efficiency of the diode sputtering process was greatly improved by the addition of a magnetic assembly placed behind the target material. The magnets are arranged to form a closed loop, magnetic tunnel on the target material surface. The magnetic tunnel efficiently traps electrons and holds them close to the target surface. The resulting improvement in ionization efficiency of the argon gas allows the pressure to be reduced thus increasing the mean free path of the argon ions in the plasma. The increased mean free path results in less energy loss from collisions as the argon ions are accelerated into the target surface by the negative voltage potential. The sputtering of the target material is increased in the region of the magnetic tunnel, and the resulting erosion zone is universally referred to as the "racetrack".

The most commonly used magnetron sputtering device is the planar magnetron. The term planar describes the target material, which, in the vast majority of cases, takes the form of a rectangular or circular flat plate. The invention of the device is credited to Chapin in U.S. Pat. No. 4,166,018 and entitled "Sputtering Process and Apparatus". Magnets positioned behind the target plate produce a magnetic tunnel, which confines the plasma and defines the sputtering racetrack. Several types of magnetic assemblies exist, which shape the plasma into a closed loop whose cross-sectional shape depends upon the particular details of the magnetic design. Additionally, magnetic assemblies designed for the sputtering of non-magnetic materials usually are less complex than those designed for the sputtering of magnetic materials.

Although magnetron sputtering has become a key technology used in many commercial applications, problems remain to be solved and improvements continue to be made. The sputtering process is inherently very inefficient. On average over 80% of the energy of each accelerated argon ion that strikes the target surface goes into heating the target, and less than 20% to ejecting target atoms. Therefore, all magnetrons must have an efficient target cooling system to stabilize the process at a relatively low temperature. In addition, most simple magnetic assemblies produce racetrack erosion zones that are sharp and narrow, leading to low utilization of the target material.

In general a cross-sectional view of the construction details of a circular planar magnetron will appear identical to that of a rectangular planar magnetron. Indeed, a rectangular planar magnetron may be visualized as a circular magnetron that has been cut in half with a linear extension of the same cross-sectional construction placed between the two halves. However, a design that is advantageous for one type of device may not be as useful for the other. The reason for this is that the two types of magnetrons are usually operated differently when coating substrates. The rectangular planar magnetrons are most often employed for coating large, rectangularly shaped substrates in a dynamic or "pass-by" mode. The round ends of the magnetron are generally shielded, or at least extend past the substrate at each end, to improve coating uniformity perpendicular to the direction of motion of the substrate. A non-uniform deposition pattern across the width of the magnetron is of little or no consequence on coating thickness uniformity because of the averaging effect of the substrate motion. However, a non-uniformity in chemical composition as a function of coating thickness still exists for coatings formed by reactive sputtering. For example, this subtle, but important effect can cause degradation in the quality of transparent, electrically conducting coatings.

Circular planar magnetrons are used to coat round, wafer-like substrates placed symmetrically in front of the target, and held stationary with respect to the target during the deposition. This is commonly referred to in the industry as "static" mode. Since there is no substrate motion to help average out non-uniformities, much more care in the details of the magnetron design is required if uniform coatings are to be obtained. Simply rotating the substrate about its center does not improve the uniformity, because the deposition pattern is radially symmetric. A circular magnetron, which has very uniform erosion of the target material across its surface, will not coat a round substrate uniformly unless the diameter of the magnetron is much greater than the diameter of the substrate, or unless the substrate is placed very close to the target surface. Neither of these solutions is practical. In the first instance, the targets must be so much larger than the substrate that the net efficiency of utilization of target material is very poor. In the second instance, the substrate is so close to the target that substrate heating is too severe. The problems with the circular planar magnetron are therefore uniquely different from those of the rectangular planar magnetron. The challenge for the circular planar magnetron is to find a design that gives uniform coatings throughout target life, while obtaining reasonable target utilization in a format where the diameters of the magnetron and substrate are substantially the same, i.e. less than about a factor of two different. For example, in the magnetic memory disk coating industry, 95 mm diameter disks are coated with sputtering targets that are about 150 mm in diameter.

Some of the more recent improvements in magnetron designs include U.S. Pat. No. 4,865,708 issued to Welty and entitled "Magnetron Sputtering Cathode". This patent describes a method for improving target material utilization that changes the usual convex shape of the magnetic field lines, which form the magnetic tunnel, to a slightly concave shape, which results in a broader sputtering groove. The methods used include locating magnetically permeable material between the poles of the usual permanent magnets, as well as combinations of permanent magnets, electromagnetic coils, and permeable material arranged to accomplish a similar result. The prior art for the preferred embodiment is shown in FIG. 1 as a cross-sectional view. Permanent magnets 1 are placed on magnetically permeable pole piece 2 to form magnetic field structure 3. Magnetically permeable elements 4 cause magnetic field lines 5 to become slightly concave in the region of target 6, thus broadening the sputtering groove. No method is provided to allow adjustment of the magnetic field profile during the life of the target, and there is no data on coating uniformity.

The improvement by Manley in U.S. Pat. No. 4,415,754 entitled "Method and Apparatus for Sputtering Magnetic Target Materials" is shown in the cross-sectional view of FIG. 2. Elements common to those in FIG. 1 are labeled with the same numerals. Although FIG. 2 is similar in appearance to FIG. 1, the function of magnetically permeable material 2 (called a magnetic shunt) is different because target material 6 is magnetic. As target 6 erodes, the strength of magnetic field lines 3 would normally intensify rapidly. This would cause the sputtering groove to become increasing sharp and narrow, yielding very poor target material utilization. The addition of magnetic shunt 4 shorts some of the field as the target erodes and improves target utilization. However this design, like the others, does not provide for any magnetic field adjustment during operation. Data for coating uniformity on statically sputtered substrates is not discussed.

Another way to improve the utilization of the target material is to move the magnetic assembly (which moves the sputtering groove) during operation of the device. An example of this method is shown in FIG. 3 as a plan view. This device is described by Demaray et al in U.S. Pat. No. 5,252,194 entitled "Rotating Sputtering Apparatus for Selected Erosion". Closed loop magnetic assembly 7 is positioned asymmetrically with respect to circular target position 6a. During operation magnetic assembly 7 is made to rotate around the center of target position 6a, thus sweeping the sputtering groove formed by the magnetic assembly over substantially the entire surface of the target. While target utilization is improved by this design, problems still exist with deposition uniformity for static substrates. Additionally, if the target material is magnetic, eddy current losses increase as the speed of rotation of the magnetic assembly is increased. This can be a problem for short deposition times.

Still another improvement to the planar magnetron was described by Manley in U.S. Pat. No. 5,262,028 entitled "Planar Magnetron Sputtering Magnetic Assembly". A cross-sectional view illustrating the method is shown in FIG. 4. Elements common to those of previous figures are labeled with the same numerals. The device uses conventional magnets 1 oriented with their poles in opposite (normal) directions, and perpendicular to the plane of pole piece 2. However, in this case, pole piece 2 is not formed in a simple flat geometry but it is shaped in a particular way to accommodate an auxiliary array of magnets 1a oriented with their poles parallel to the plane of pole piece 2. The magnets and the shape of the pole piece cause field lines 3 in the region of the sputtering groove of target 6 to flatten and become concave. As in other methods previously discussed, this causes the sputtering groove to broaden and target utilization to be improved. Adjustment of the magnetic field during operation is not allowed for in the design, and coating uniformity is not discussed.

A design for a magnetic assembly which uses a series of concentric electromagnetic coils is described by Potter in U.S. Pat. No. 5,262,030 entitled "Magnetron Sputtering Cathode with Electrically Variable Source Size and Location for Coating Multiple Substrates".

The device is further described in a paper by Potter and Wilson entitled "Performance of a Variable-plasma Computer-controlled Sputtering Source", *Surface and Coatings Technology,* 72(1995) 196–199. A cross-sectional view of this device is shown in FIG. 5. Pole piece 2 is relatively thick in comparison to the preceding devices, and it contains a concentric series of gaps 8, which support a series of independent electromagnetic coils 9. Target material 6 is held in close proximity to the yoke portions of pole piece 2, which are formed by the material left between gaps 8. Permanent magnets are not used in the device. By energizing various sets of coils, at relatively high current levels, the magnetic field that forms the sputtering groove may be swept radially across the face of the target to spread the sputtering groove and increase target utilization. Alternative types of sweep patterns also are discussed in the patent.

While the magnetron works in principle and has a broad range of adjustability, it is both mechanically and electrically complex to construct and operate.

What is needed is a simplified design for a circular planar magnetron, which provides reasonably good target utilization, and at the same time allows for control of sputtering groove positions and erosion rates during operation. This is necessary to maintain thickness uniformity in statistically deposited coatings throughout the lifetime of the target.

All of the patents cited above are hereby incorporated by reference for purposes of additional disclosure.

SUMMARY OF THE INVENTION

Accordingly, it is an object of the present invention to provide a circular planar magnetron sputtering device for uniformly coating wafer-like substrates with thin films.

A second object of the present invention is to provide a circular planar magnetron sputtering device with controllable film uniformity over the life of the target.

Another object of the present invention is to provide a simplified magnetron sputtering device that gives improved target life.

Yet another object of the present invention is to provide a magnetron sputtering device whose sputtering groove and associated plasma can be adjusted during operation without the use of mechanically moving parts.

In accordance with one aspect of the present invention, the magnetron sputtering device comprises a set of primary permanent magnets whose magnetic poles have the same orientation with respect to the target plate. These inner and outer primary magnets are respectively located at the center and at the periphery of a magnetically permeable circular backing plate. This configuration is contrary to the prior art methods; hence the name "inverted" magnetron. A set of permeable pole pieces, possibly with secondary trim magnets, is located between the set of primary magnets. If trim magnets are used, their field directions are determined by the type of target (magnetic or non-magnetic) to be sputtered. The basic design of this magnetic assembly produces a magnetically decoupled pair of sputtering rings whose electron drift directions are opposite one to the other. A first electromagnetic coil is located near the inner primary magnet, and a second electromagnetic coil is located near the outer primary magnets. When sputtering power is applied to the device, a pair of plasma sputtering rings form. When AC, AC plus DC, or pulsed DC power is applied to the electromagnetic coils, the pair of sputtering rings are shifted and/or oscillated about their nominal positions which are fixed by the permanent magnets alone. The design is easily scaleable to accommodate different substrate diameters and varying target to substrate distances. The design may also be adapted to rectangular planar magnetrons, but the advantages for pass-by sputtering are not as great as for static sputtering.

According to another aspect of the present invention, the nominal locations (determined by the permanent magnets) of the sputtering rings, as revealed by the most intense part of the plasma, can be radially offset by DC biases applied to the electromagnetic coils. This provides a method of adjusting for target thickness changes to maintain coating uniformity during the life of the target.

According to still another aspect of the present invention, target material utilization is improved by oscillating the plasma sputtering rings around their nominal and/or DC offset positions to broaden the sputtering grooves during operation. For magnetic targets the oscillation positions may be further controlled by the use of narrow grooves precut into the target material, and/or by varying the targets cross-sectional shape. The groove oscillation is adjusted to eliminate any regions of coating deposition on the target surface thus yielding full surface erosion of material.

According to a further aspect of the present invention, the density of magnet loading, and the level of bias currents may be varied to accommodate the sputtering of magnetic as well as non-magnetic target materials.

An advantage of the present invention is that the new magnetron sputtering device can produce very uniform coatings throughout the life of the target.

Another advantage of the present invention is that the new magnetron sputtering device can readily accommodate either non-magnetic or magnetic target materials.

Yet another advantage of the present invention is that it provides very uniform coating on a round wafer-like substrate consistent with maximum possible target utilization.

A further advantage of the present invention is that the full surface erosion of the target material eliminates flaking from coating buildup and reduces arcing.

Still another advantage of the present invention is that it provides a highly sophisticated sputtering device in a small, economical package that is easily adaptable to a variety of existing sputtering machines.

These and other objects, features and advantages of the present invention will become apparent to those skilled in the art after having read the following detailed description of the preferred embodiments, which are illustrated in the several figures of the drawing.

IN THE DRAWING

FIG. 7 is a schematic diagram showing the top plan view of the directly water-cooled version of the magnetron body illustrated in FIG. 6a.

DESCRIPTION OF THE PREFERRED EMBODIMENT

Figure 1:
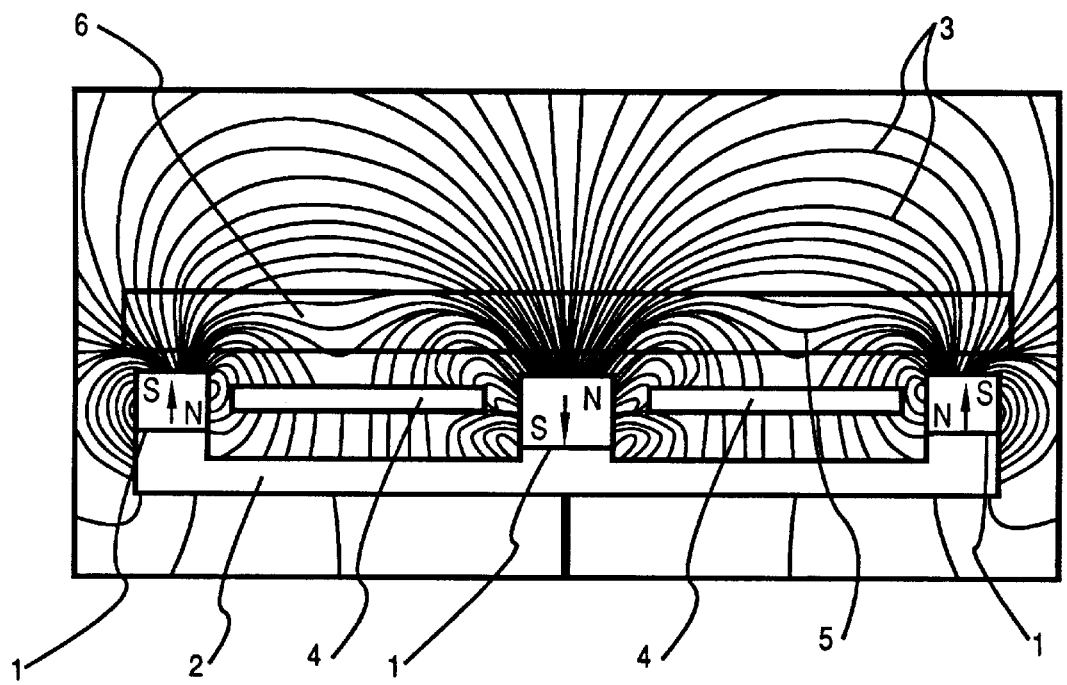
FIG. 1 is a schematic cross-sectional diagram of a prior art magnetic assembly for a magnetron sputtering device which uses permeable material to reshape the magnetic field lines to improve target material utilization for non-magnetic targets.
Figure 2:
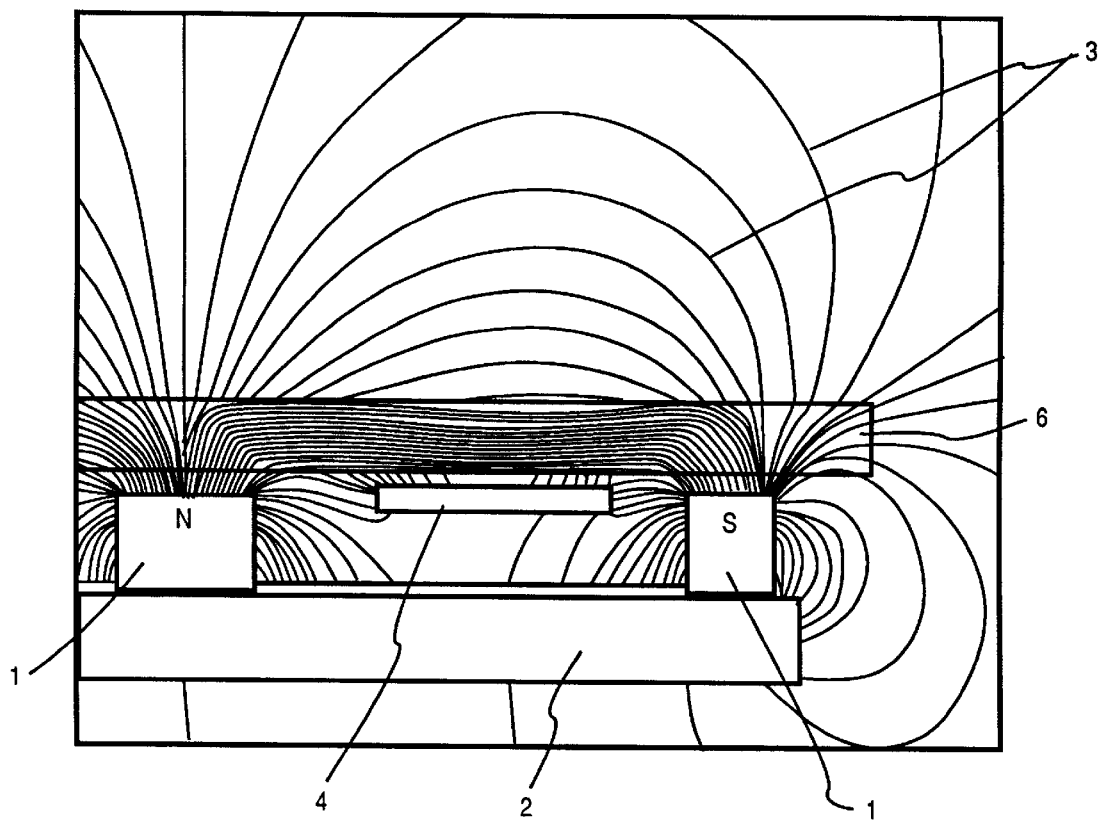
FIG. 2 is a schematic cross-sectional view of a prior art magnetic assembly for a magnetron sputtering device which uses a magnetic shunt to improve target utilization for magnetic targets.
Figure 3:
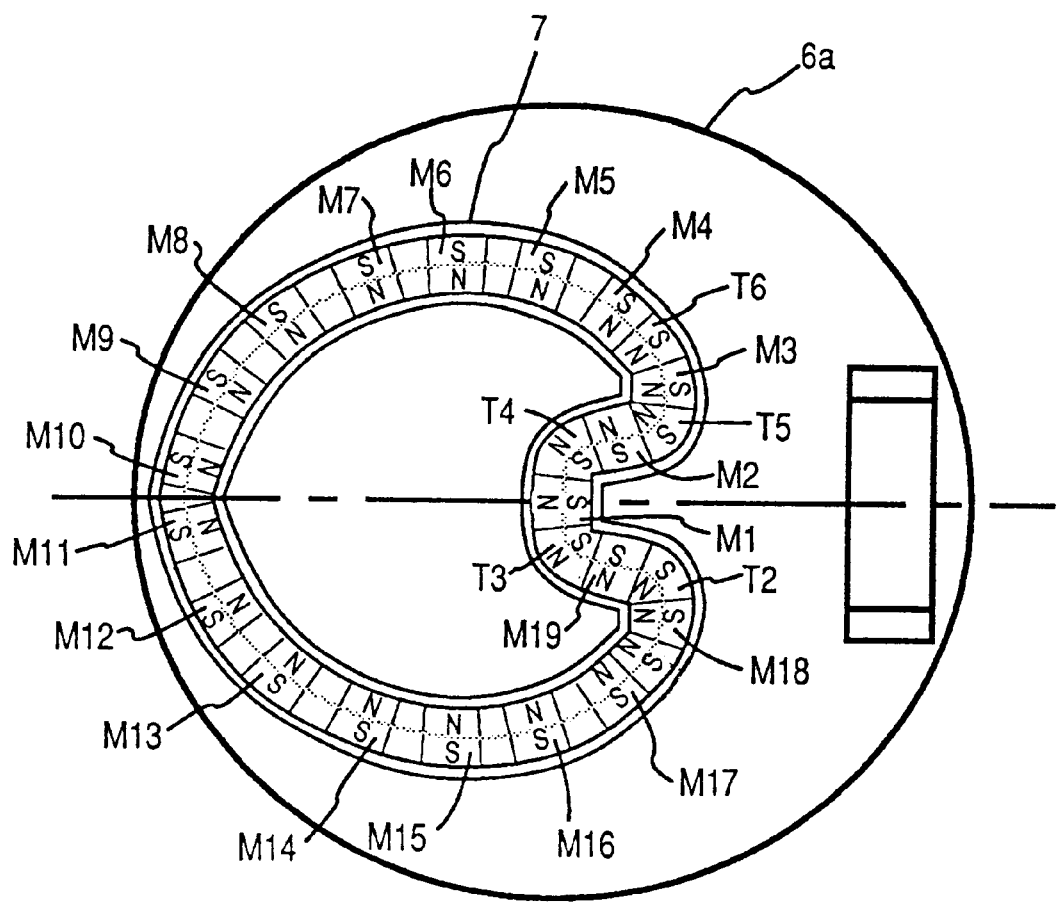
FIG. 3 is a schematic planar view of a prior art magnetic assembly for a magnetron sputtering device which uses rotation of the assembly to improve target material utilization.
Figure 4:
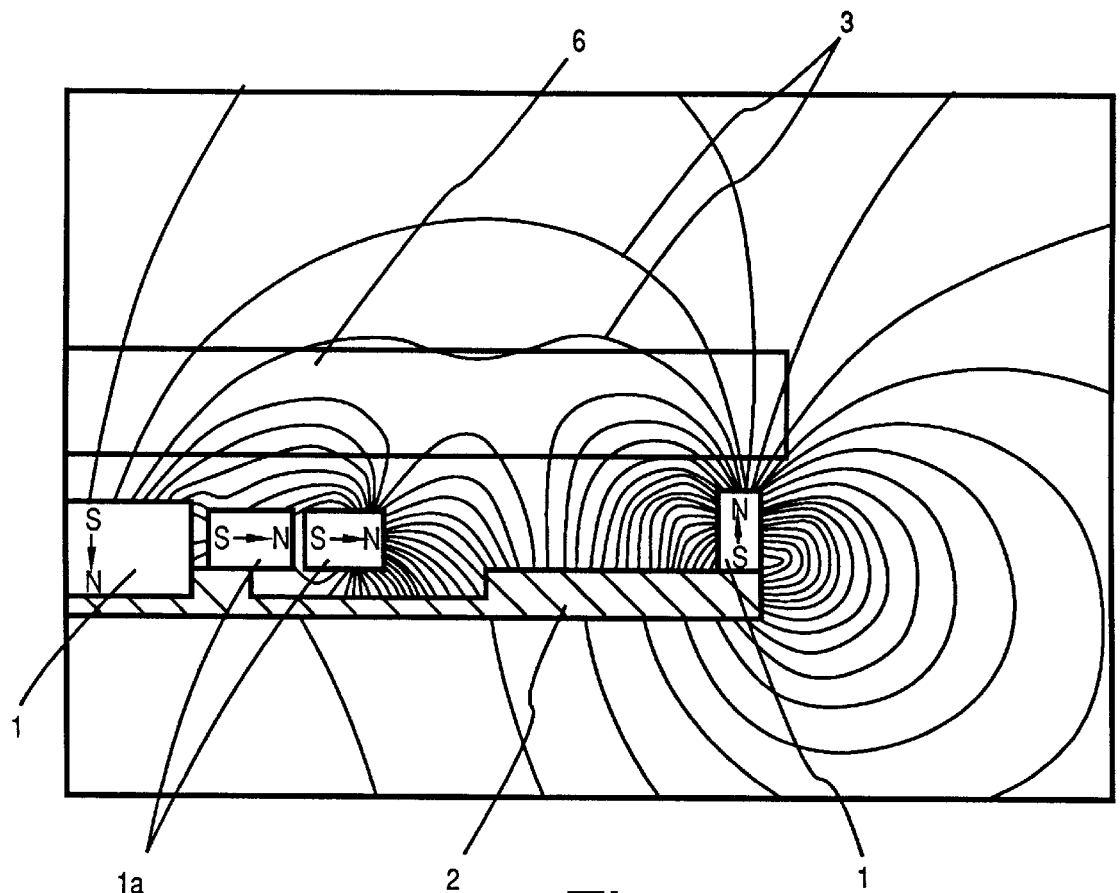
FIG. 4 is a schematic cross-sectional diagram of a prior art magnetic assembly for a magnetron sputtering device which uses a set of secondary magnets turned 90 degrees to the primary magnets, and a shaped magnetic backing plate to provide improved target material utilization.
Figure 5:
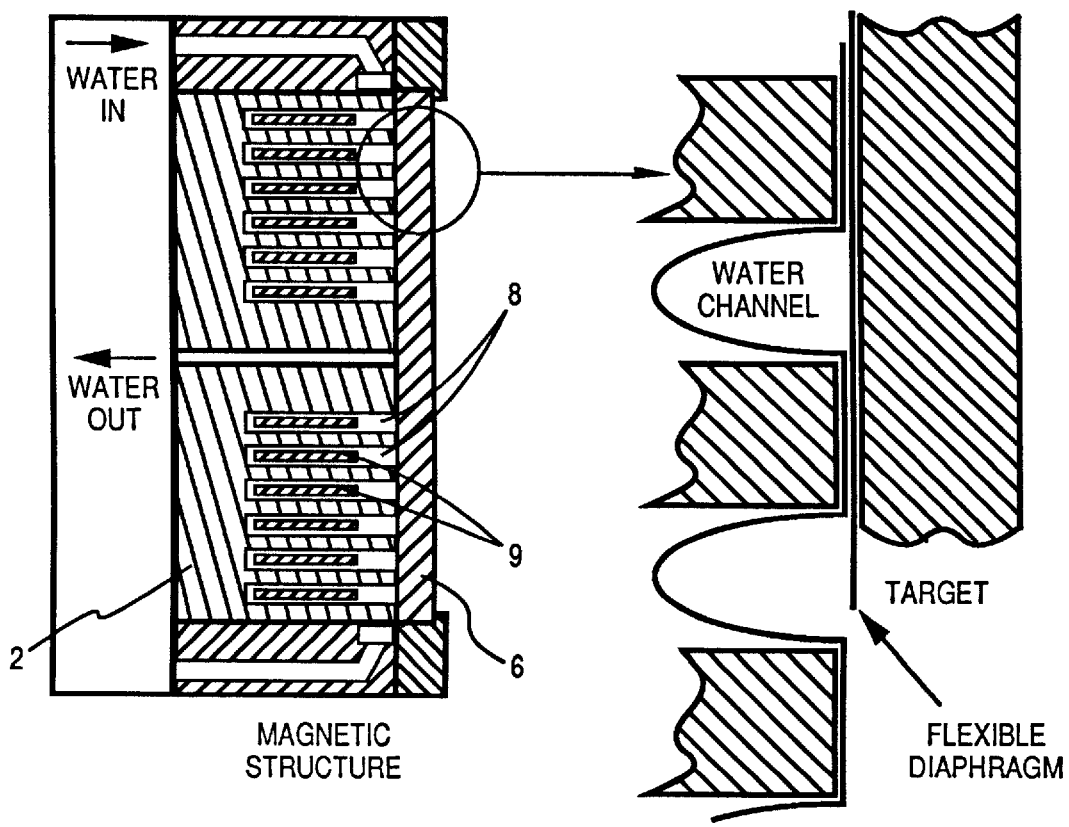
FIG. 5 is a schematic cross-sectional view of a prior art magnetic assembly for a magnetron sputtering device which uses concentric electromagnetic coils placed in concentric gaps in a backing plate. Energizing pairs of coils in a sweeping pattern is used to improve target material utilization.
Figure 6A:
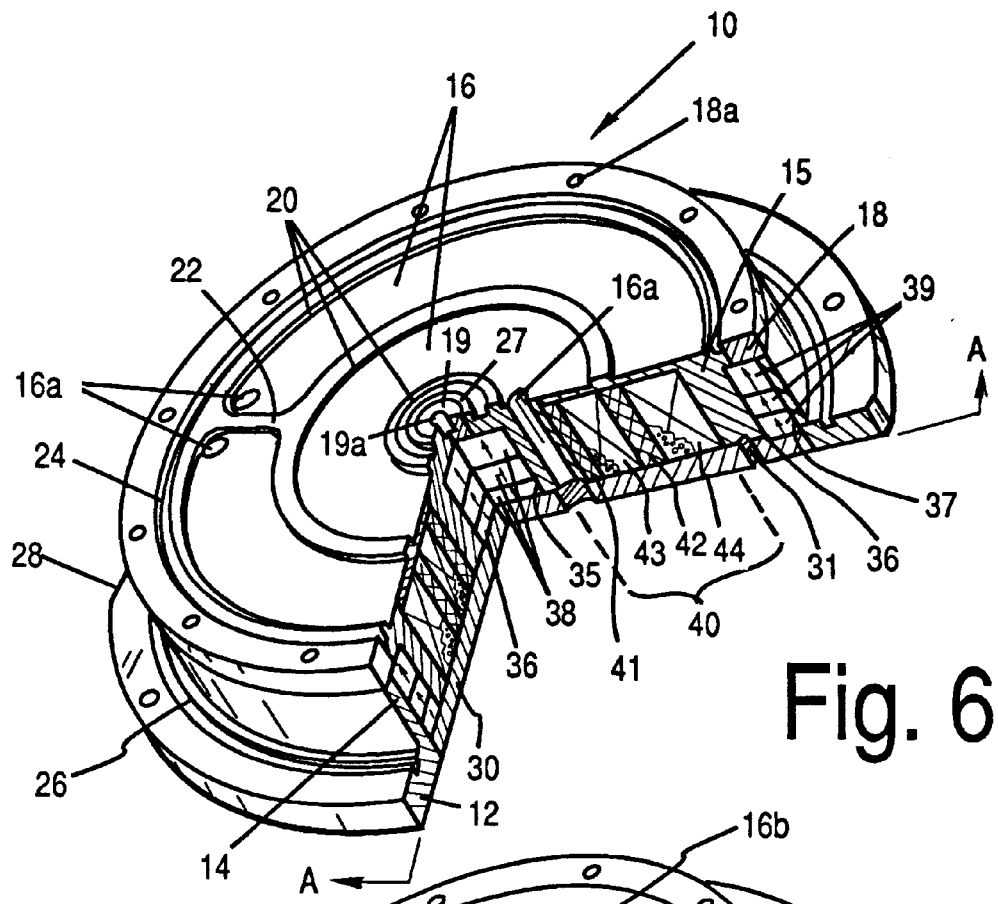
FIG. 6a is a partially cut-a-way, isometric diagram showing a version of a magnetron body in accordance with the present invention adapted for direct water cooling of the target. For better clarity the magnetron is shown without the target attached.

The inverted field magnetron sputtering device of the present invention may be configured for direct water cooling of the target material, or it may be configured for indirect water cooling by utilizing a thin metallic membrane or bladder. The indirectly water-cooled version eliminates the risk of water leaks from the target seal into the vacuum system, but target cooling efficiency is reduced. FIG. 6a shows a schematic sectional isometric view of the target side of the magnetron configured for direct water cooling. The structural body of the device 10 consists of mounting flange 12 with outer cylindrical wall 14, primary annular structure 15 in which are formed shallow channels 16 for water flow, outer ring 18 and central disk 19 provide the foundations for threaded holes 18a and 19a used for clamping the target (not shown in the figure) to the body with its back surface engaging the target side of the structure. Ring 18 and disk 19 may be made from magnetically permeable material (e.g. 400 series stainless steel) to serve as pole pieces. These parts are welded together to form a single rigid unit. Raised circular regions 20 and their connecting webs 22 provide contact regions that bear against the back surface of the target plate to direct the water flow around channels 16. At two locations in each channel, entrance and exit holes 16a for coolant flow are provided which extend through the magnetron body to the back side of the device. Groove 24 holds an O-ring (not shown) that provides the coolant seal between the target plate and the magnetron body, and groove 26 holds an O-ring (not shown) which provides the vacuum seal between the magnetron body and the sputtering machine. Groove 27 holds an O-ring (not shown) for optional central target clamping. Mounting flange 12 is shown with optional flats 28, which are arranged 180 degrees apart to minimize the distance between multiple magnetrons when they are mounted side-by-side. For internal mounting, for example on a plate that is itself vacuum sealed to the sputtering machine, flange 12 with O-ring 26 may be removed altogether. The exact mounting configuration is dependent upon the system the magnetron is used on, and is not a required feature of the invention. Preferred construction materials include non-magnetic and magnetic stainless steels and copper and its alloys. Mild steel serves well as pole pieces, but it should be nickel plated to minimize rust formation.

Figure 13:
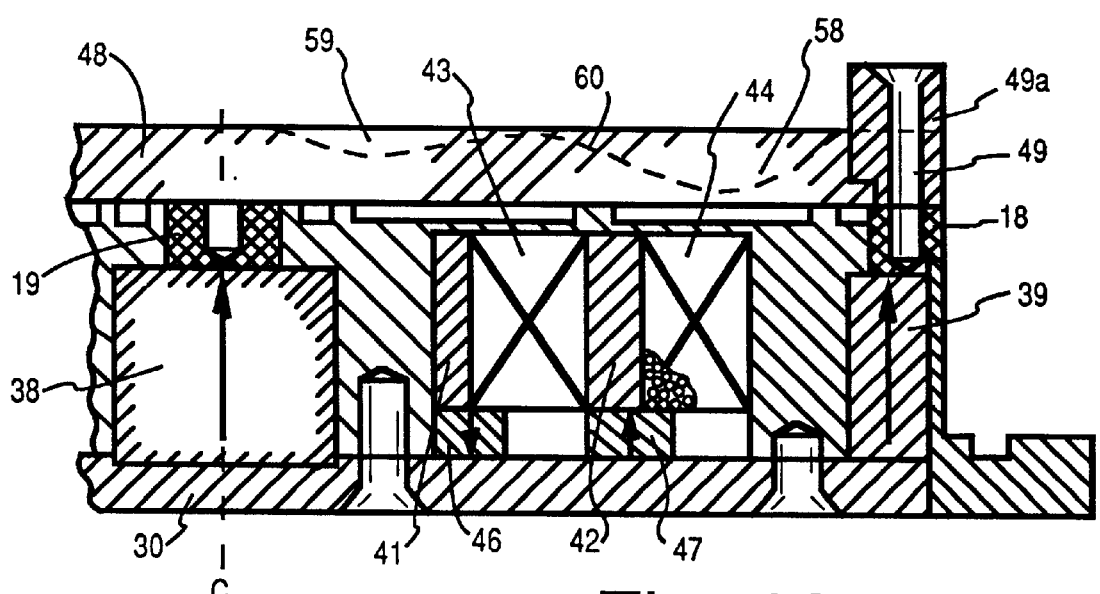
FIG. 13 is a partial cross-sectional diagram of the prototype magnetron and target optimized for non-magnetic target material built according to the computer-generated model shown in FIG. 10.

Backing plate 30 is made from magnetically soft material to serve as a keeper for the magnets. It is attached to primary annular structure 15 by a set of screws 31, and it has appropriately located holes aligned with holes 16a in annular structure 15 to allow passage for the water cooling tubes. The shallow recessed regions 36 in the backing plate serve only as guides to position one or more inner magnets 38 and one or more outer magnets 39 for assistance in assembly. In this embodiment, magnets 38 are round disks which approximately fill the center cylindrical cavity 35 formed by structure 15, while magnets 39 approximately fill an outer annular cavity 37, and may be constructed from a single annular ring of material, or made up of a stacked arrangement of thinner rings (or arcuate segments) as suggested in the figure. More conveniently, the annular rings themselves may be approximated by a series of individual straight segments vertically oriented and arrayed in "soldier fashion", or horizontally oriented and arrayed end to end. But in either case, the magnetic polarization must be in the direction normal to the target plate (FIG. 13). For example, in the present invention, magnetic ring 39 is approximated by a series of sixteen one-inch long individual magnets. Since the inverted design has poles oriented to repel each other, magnetic anomalies in the individual magnets tend to be smoothed out, so that a more circumferentially symmetric magnetic field results.

A middle annular cavity 40 is provided between inner magnets 38 and outer magnets 39. This cavity contains inner and outer annular pole pieces 41 and 42, and inner and outer low power annular electromagnetic coils 43 and 44. Small permanent magnets (not shown) may be placed at the bases of pole pieces 41 and 42 for fine tuning of the static magnetic field structure. Coils 43 and 44 are illustrated as filling the available cavity space; however, this is not a requirement. The coils are wound circumferentially, as suggested in the figure, and they are sized for the particular performance desired for the magnetron. Additionally, the coils are electrically insulated from the rest of the magnetron, but they are thermally heat sunk to the structure for temperature control.

Figure 6B:
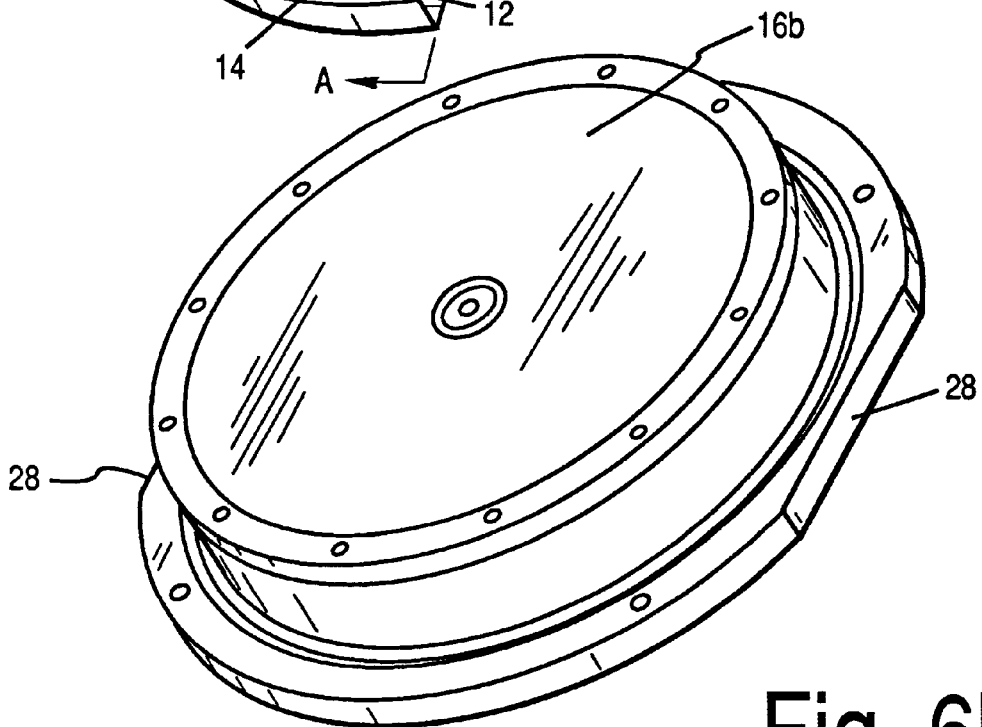
FIG. 6b is an isometric schematic diagram showing an alternative version of a magnetron body in accordance with the present invention adapted for indirectly water cooling the target. The magnetron is shown without a target attached.

FIG. 6b shows a schematic isometric view of the target side of an alternative embodiment of a magnetron in accordance with the present invention configured for indirect water cooling. The indirectly water cooled version is almost identical to the directly water cooled version shown in FIG. 6a, except that a thin metallic circular membrane 16b is welded over raised circular regions 20 and connecting webs 22 (FIG. 6a) of the target side of the body. O-ring grooves 24 and 27 (FIG. 6a) may be eliminated. The circular membrane should be strong enough to hold the pressure of the water, and it should be a good heat conductor to transfer heat from the target. Useful materials are copper, beryllium copper, and nickel.

Figure 7:
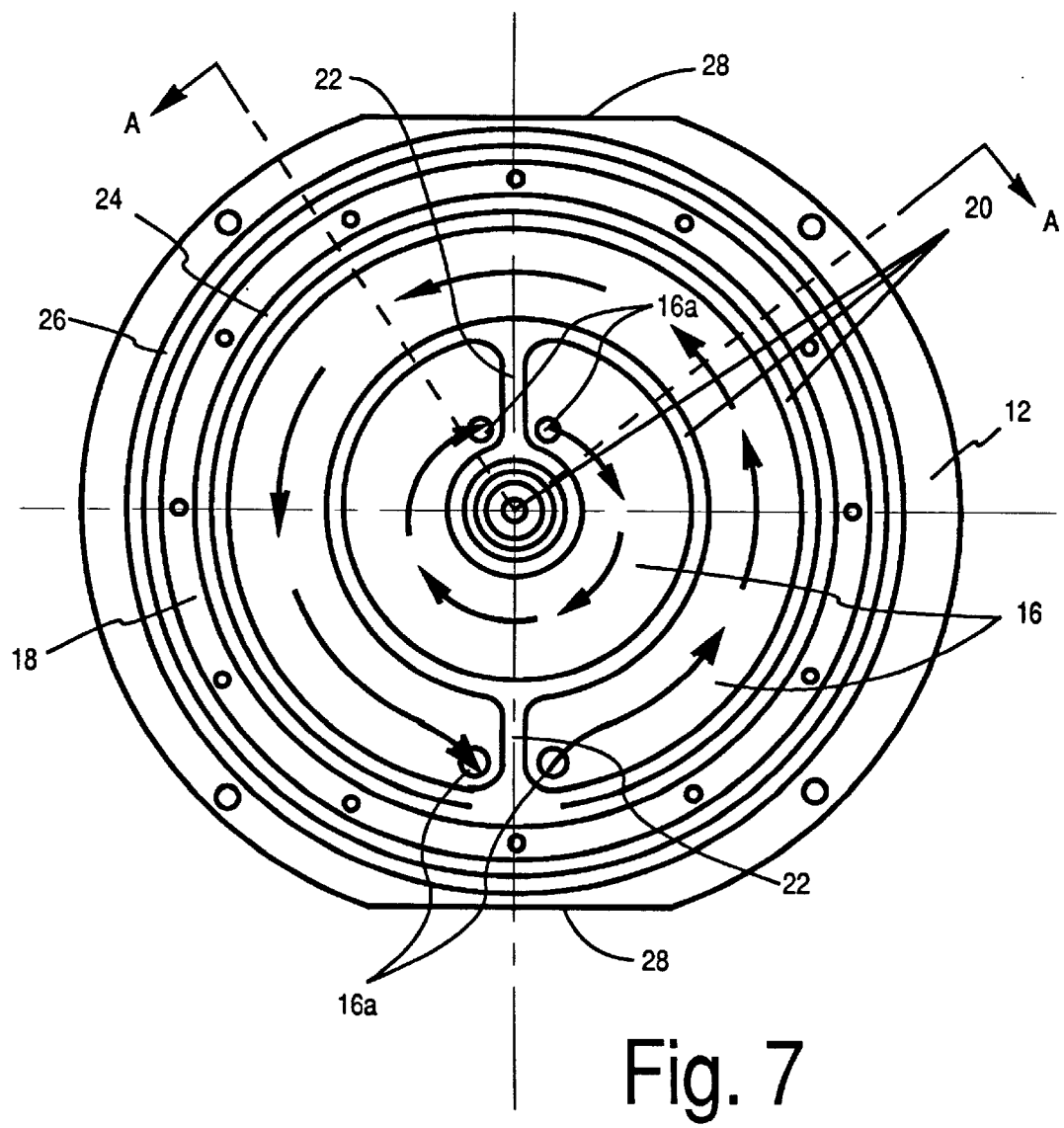

FIG. 7 is a plan view of the target side of the magnetron shown in FIG. 6a. Common elements of the two figures are labeled with the same numerals. Water passages 16a extend from the level of water channel regions 16 through the magnetron body to its back side where attachments for electrically insulating tubes (not shown) are provided. Water is circulated around the channels in opposite directions as indicated by the heavy dashed arrows. Circulation of the water in opposite directions helps maintain a more uniform target temperature, although that feature is not absolutely essential to the operation of the magnetron.

Figure 8:
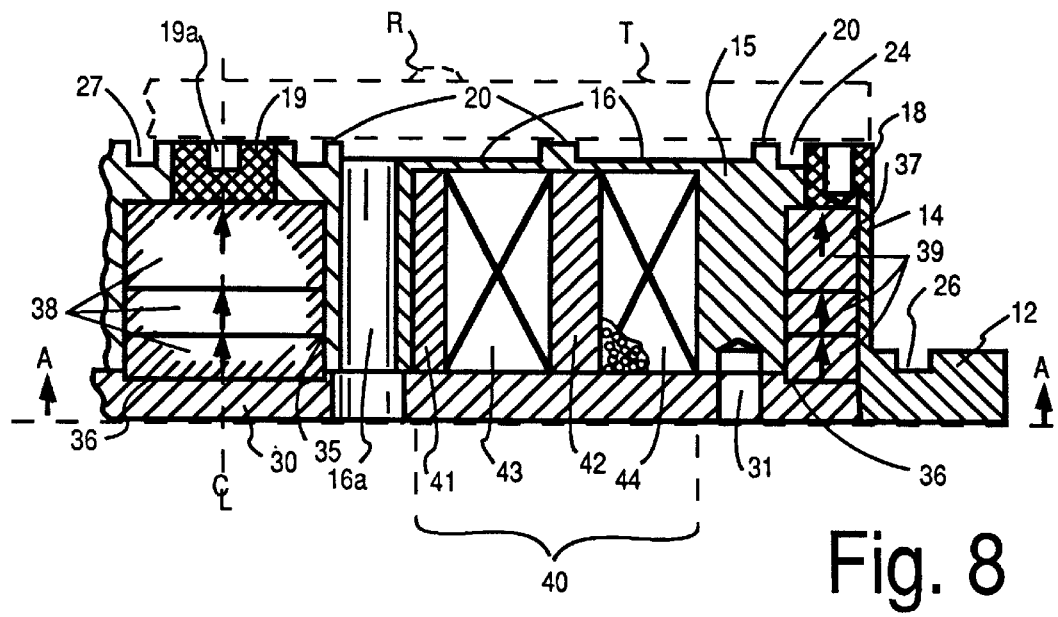
FIG. 8 is a large scale schematic partial cross-sectional view taken along the folded plane (and line) A—A of FIGS. 6a (and 7), of the directly water cooled version of the magnetron body showing the preferred internal arrangement of permanent magnets and electromagnetic coils.

FIG. 8 is an enlarged partial cross-sectional schematic view of the directly water-cooled magnetron shown in FIG. 6a. The section is taken through plane A—A of FIG. 6a as indicated, and it is symmetrical about its centerline ("CL") with the exception of bolt holes, mounting flange flats, and those features associated with water cooling. Elements that are common to those of FIG. 6a are labeled with the same numerals. Primary annular structure 15 forms the central structural element of the magnetron body. Outer ring 18 and central disk 19 (cross-hatched) are welded to primary ring 15, and outer cylindrical wall 14 (with mounting flange 12) is welded to outer ring 18 to form a single unit. As previously stated, elements 18 and 19 are normally made from magnetically permeable material, but this is not strictly necessary. In addition to a central cylindrical cavity 35 to hold magnets 38, and an outer annular cavity 37 to hold magnets 39, the magnetron body contains a relatively large middle annular cavity 40. Cavity 40 houses annular pole pieces 41 and 42 as well as low power annular coils 43 and 44. Backing plate 30 is attached to primary ring 15 by a set of bolts (not shown). The backing plate 30 is made of magnetically permeable material, and it forms a back pole piece for the magnets and provides strengthening of the structure against flexure.

With proper loading of permanent magnets 38 and 39, the inverted magnetron will produce highly uniform coatings over most of the life of a target (not shown) with only a single annular pole piece placed in cavity 40. However, target life will be reduced, coating uniformity will suffer near the end of target life, and a narrow ring "R" of target material "T" will be redeposited, or formed, on the outer face of the target at approximately the position of the pole piece. While the device is economically useful in this mode of operation, its performance is greatly enhanced by the addition of a second pole piece and one or two low power electromagnetic coils to annular cavity 40.

Figure 9:
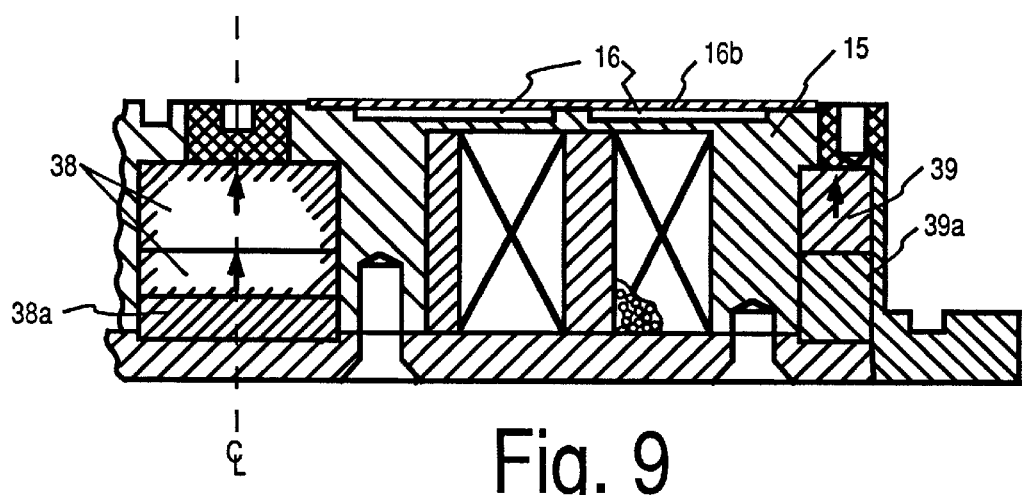
FIG. 9 is a schematic cross-sectional view of the indirectly water-cooled version of the magnetron body of FIG. 6b showing the internal arrangement of permanent magnets and electromagnetic coils.

FIG. 9 is a partial cross-sectional schematic view of the indirectly water-cooled magnetron shown in FIG. 6b. It is almost identical in construction to the magnetron described in FIG. 8, the primary differences being that water cooling channels 16 are encapsulated by annular metallic membrane 16b, and the O-ring grooves (24 and 27 in FIG. 6a) for sealing the target are removed since they are no longer needed. Metallic membrane 16b may be constructed from copper, beryllium-copper, nickel, or other strong, heat conducting metals or alloys. It is welded to body 15, and it should be thin enough to flex slightly under the pressure of the cooling water to make good thermal contact to the rear surface of a sputtering target (not shown). Membrane 16b may have a convenient thickness of about 0.020 to 0.030 inches, but depending upon the strength of the material chosen for construction, the thickness should be adequate for the membrane to be mechanically functional and structurally reliable, i.e. not rupture under the pressure of the cooling water. In either embodiment (i.e. FIG. 8 or FIG. 9) magnets 38 and 39 need not necessarily fill the entire space available in the cavities. For example, as shown in FIG. 9, magnetic pole pieces 38a and 39a (of arbitrary thickness) may be substituted for a portion of the magnet stack.

Figure 10:
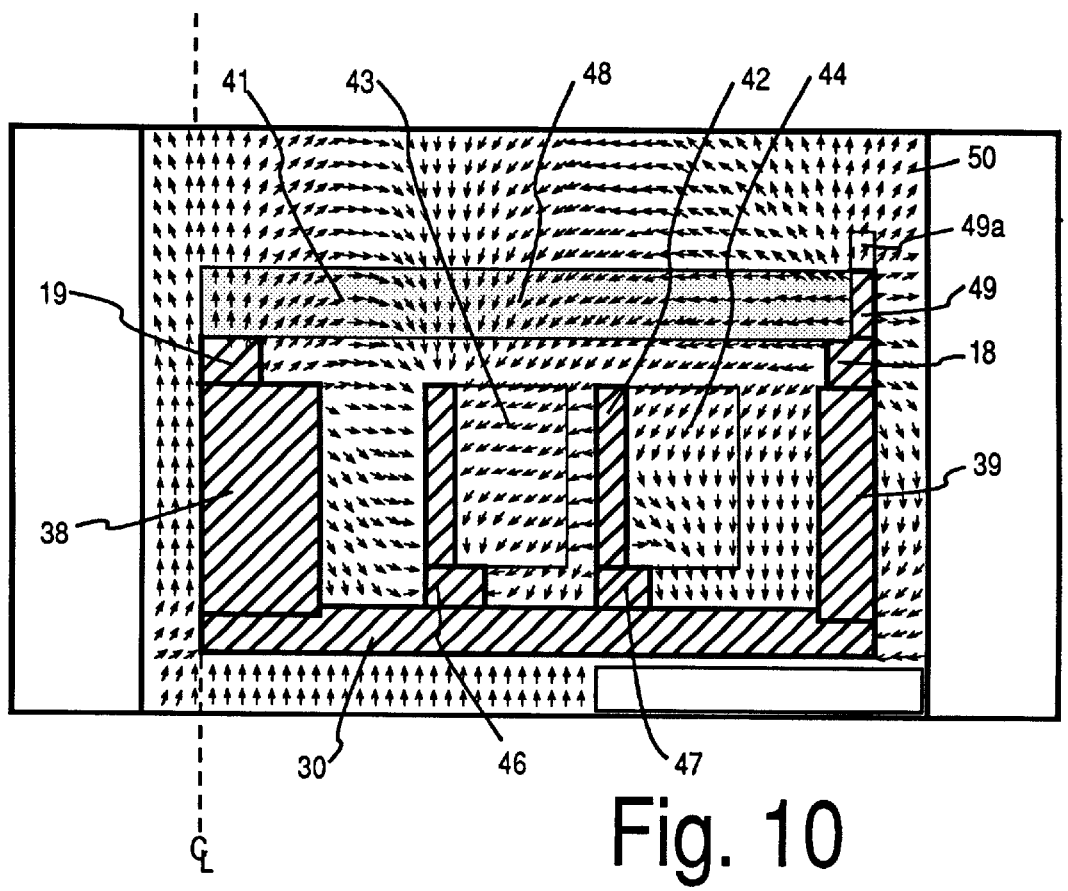
FIG. 10 is an example of a computer-generated model showing the calculated distribution of the magnetic fields for a symetrical half of a magnetron designed in accordance with the present invention for sputtering non-magnetic target material.

A computer code for calculating magnetic field distributions from a given physical structure gives useful guidance for the design and construction of the device. FIG. 10 illustrates an example for a particular magnetic design for sputtering a non-magnetic target 48 whose initial thickness is 0.375 inches. The illustration is highly schematic and shows only the magnetically active parts of the magnetron along with the non-magnetic target. Elements of the simplified structure shown in FIG. 10 that correspond to those in previous figures are labeled with the same numerals. In this design annular pole pieces 41 and 42 are sitting on tuning magnets 46 and 47 as previously mentioned. In this example for a non-magnetic target, tuning magnets 46 and 47 have opposite polarities with magnet 47 having the same polarity as primary magnets 38 and 39. Target 48 is attached by a clamp ring 49. The ring is made from a magnetically permeable material like a 400 series stainless steel, and it has a short extension 49a above the target surface. Alternatively, target 48 may be of the commonly used bonded type, where the target material is attached to a backing plate (not shown). Because some desirable target materials lack the required physical strength (carbon, for example) they can only be used if bonded to a backing plate. Arrows 50 represent the direction of the magnetic flux generated by the permanent magnets and the low power coils. Sputtering proceeds most rapidly in regions where the arrows are parallel to the target surface. Therefore, this magnetron will develop two primary annular plasma sputtering rings, one near the ID (inner diameter) and one near the OD (outer diameter) of the target. However, unlike other circular planar magnetrons, the electrons in these two rings will circulate in opposite directions, which allows the rings to operate substantially independently.

The application of a low frequency (about 10 Hz) AC current of approximately one to seven amperes to coil 44 and/or coil 43 causes both the ID and OD plasma sputtering rings to shift radially. This broadens the sputtering erosion zones or grooves on the target and improves the target utilization. In addition, the sputtering zones from the two shifting plasma rings overlap slightly, providing the important extra benefit of keeping the target surface free from buildup of sputtered flux, which reduces arcing and flaking. The addition of a positive or negative DC current (approximately 1 to 5 amperes) to coil 43 causes the sputtering rate from the ID erosion zone to increase or decrease proportional to the increase or decrease in the strength of the local magnetic field at the ID zone. The DC current may be added as an offset to an existing AC current. This allows real time control of the ratio of the erosion rates between the OD and ID sputtering rings, which provides a unique way for a substrate to be coated uniformly throughout the lifetime of the target.

Figure 11:
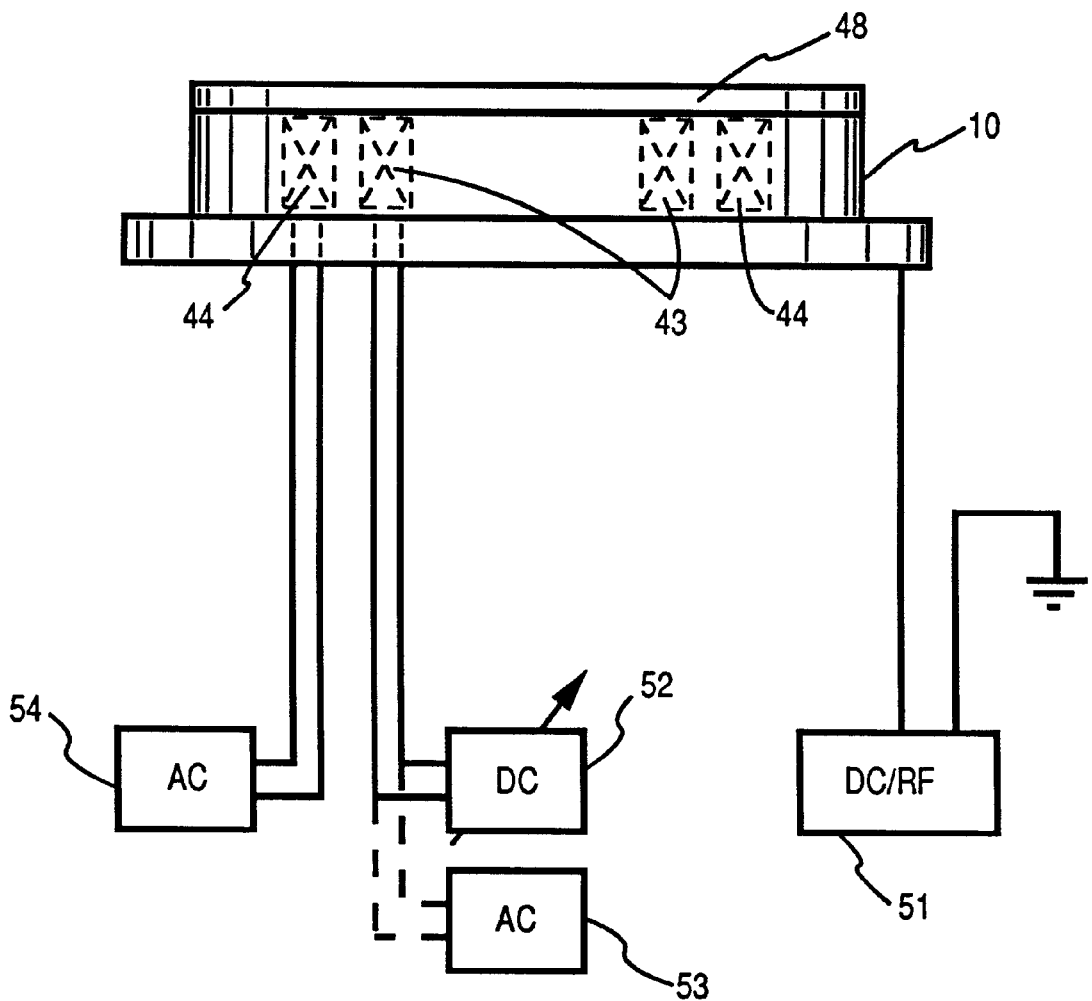
FIG. 11 is a schematic block diagram illustrating the preferred operational mode for the magnetron.

FIG. 11 shows the preferred embodiment for operating the inverted magnetron according to the present invention. Magnetron 10 is supplied with a target 48. Sputtering of the target is accomplished with power source 51, which may be either DC or RF. Inner electromagnetic coil 43 (shown dashed) is connected to a variable DC supply 52, which allows selective adjustment of the erosion rate of the inner sputtering groove to control coating uniformity. In addition, AC power source 53 may be connected to inner coil 43 to oscillate the sputtering grooves. Outer electromagnetic coil 44 (shown dashed) is connected to AC power source 54. The AC signal from 54 provides the primary drive for the oscillation of both sputtering grooves. AC supplies 53 and 54 may be operated out of phase with each other, or they may be in phase. For in phase operation they may be the same supply, i.e. only one supply would be needed.

Figure 12:
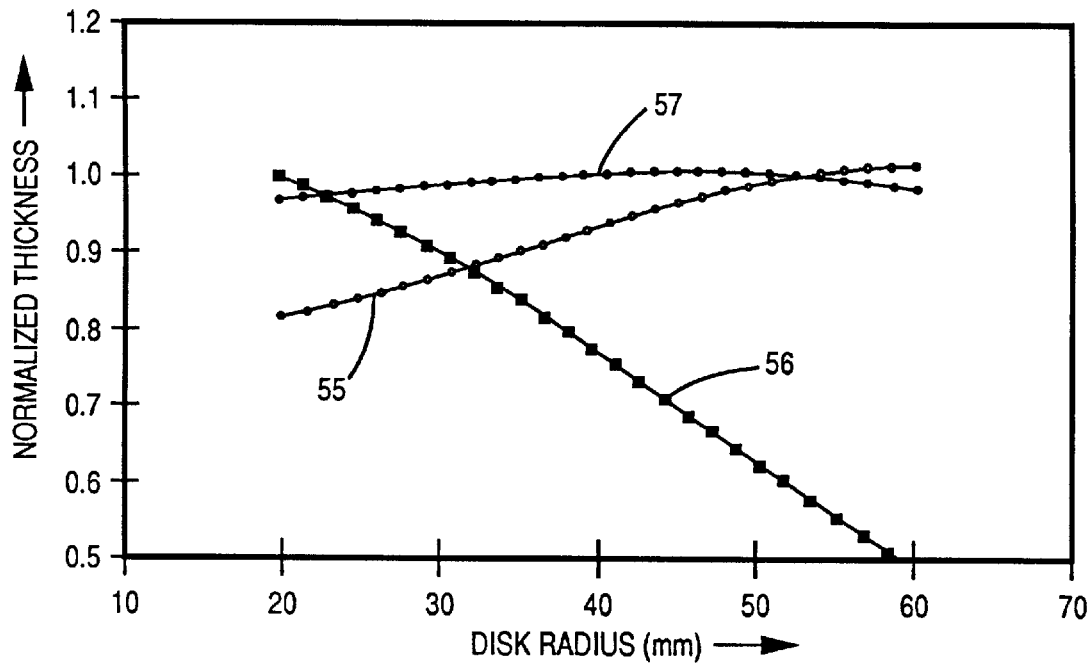
FIG. 12 is a plot of calculated radial thickness distributions for separate inner and outer sputtering rings, and the result of combining the distributions.

The motivation for this dual sputtering ring design can be demonstrated by a simple set of calculations for coating thickness vs. substrate radius for narrow ring sources. As an example, FIG. 12 shows the results for a 120 mm diameter disk substrate with a 40 mm central hole placed 50 mm from the target surface. Curve 55 is the relative thickness vs. disk radius for a single 140 mm diameter sputtering groove. The uniformity given by this ring alone is rather poor, about +/−9%. Curve 56 is the relative thickness vs. disk radius for a single 60 mm diameter sputtering groove. The uniformity given by this ring alone is extremely bad, over +/−25%. However, when 33% of the contribution of curve 56 is added to that from curve 55, the result is curve 57, which represents a coating uniformity of about +/−1%. This suggests that the dual ring source will give extremely good coating uniformity if the rings are formed in the proper positions, and if the ratio of their erosion rates can be controlled. This is indeed possible with the new inverted magnetron design.

Several variations in design are possible in the magnetron described above. However, basic to the present invention is the concept that the primary inner and outer magnetic poles are of like magnetic orientation (i.e. inverted from the usual design), with at least one annular pole piece placed between them to serve as a flux guide to the magnetic backing plate. These features (not shown in the figure) alone will provide two static plasma "sputtering rings" whose electrons circulate in opposite directions. At least one low power electromagnetic coil is required to cause either or both of the plasma sputtering rings to oscillate radially to improved target material utilization. Additional electromagnetic coils, pole pieces, or small tuning magnets provide important refinements to improved target utilization and coating uniformity for both magnetic and non-magnetic targets; however, the specific example which follows is not necessarily the only useful one.

A prototype magnetron was built according to the design suggested by the results of the computer calculations shown in FIG. 10. Sputtering experiments using a 0.375-inch thick aluminum target were then performed. FIG. 13 shows the cross-sectional view of the magnetron. Elements are labeled consistently with those used in previous figures. In this design, tuning magnet 47 is oriented with its magnetic poles in the same direction as inner and outer magnets 38 and 39. However, for a magnetic target, tuning magnet 47 would be inverted and aligned with tuning magnet 46 (i.e. opposite to magnets 38 and 39). Aluminum target 48 was operated at a power level of 3 kilowatts. Outer coil 44 was driven by a low power AC signal at a frequency of about 10 Hz. The magnetic field generated by the AC signal applied to coil 44 was sufficient to broaden both outer sputtering groove 58 and inner sputtering groove 59. The rate of sputtering from inner groove 59 is first adjusted to be near the desired level by the magnetic assembly, and then additionally controlled by a small DC signal applied to coil 43. After 130 kilowatt hours (kwh) of operation the target had developed erosion profile 60 indicated by the dashed curve. Outer groove 58 had not yet eroded all the way through the 0.375-inch thick target. The extended portion 49a of target clamp ring 49 does not sputter in this design.

Figure 14:
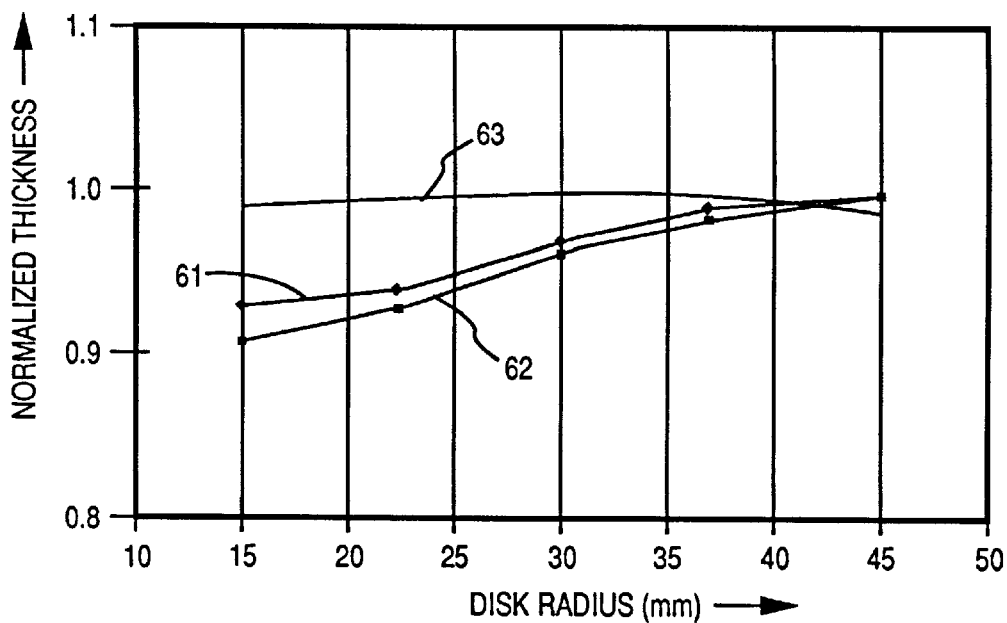
FIG. 14 is a plot of the normalized radial thickness distributions resulting from sputtering trials using the magnetron illustrated in FIG. 13.

The coating uniformity measurements for the sputtering trials described above are given in FIG. 14. The coatings were deposited on 95 mm diameter disk substrates placed two inches away from the sputtering target. In the first sputtering trial, only coil 44 was energized with a 10 Hz AC signal. Curve 61 shows the normalized thickness distribution of the coating at the beginning of target life, and curve 62 shows the normalized thickness distribution of the coating near the end of target life (at 130 kwh). The accuracy of the measurement is about +/−1%. The thickness distribution is reasonably stable throughout the life of the target, with only a small decrease in coating thickness near the center of the substrate which slowly develops over the life of the target. Coating uniformity in this mode of operation is approximately +/−4%, which is at least as good as prior art devices. In the second sputtering trial, a DC signal was added to coil 43 in the proper direction to increase the magnitude of the magnetic field above inner groove 59 (FIG. 13). With small adjustments to the DC signal throughout the life of the target, it was possible to hold the coating thickness distribution to a uniformity of about +/−1%, which was approximately the limit of the measurement accuracy. The average of these results is shown by curve 63. Target utilization was approximately 40%, determined by weighing it before and after sputtering. It is straightforward to design a circular planar magnetron to sputter a higher fraction of the target material. However, prior to this invention it has not been possible to simultaneously maintain a uniformly deposited coating throughout target life with targets and substrates of approximately equal diameter.

Figure 15:
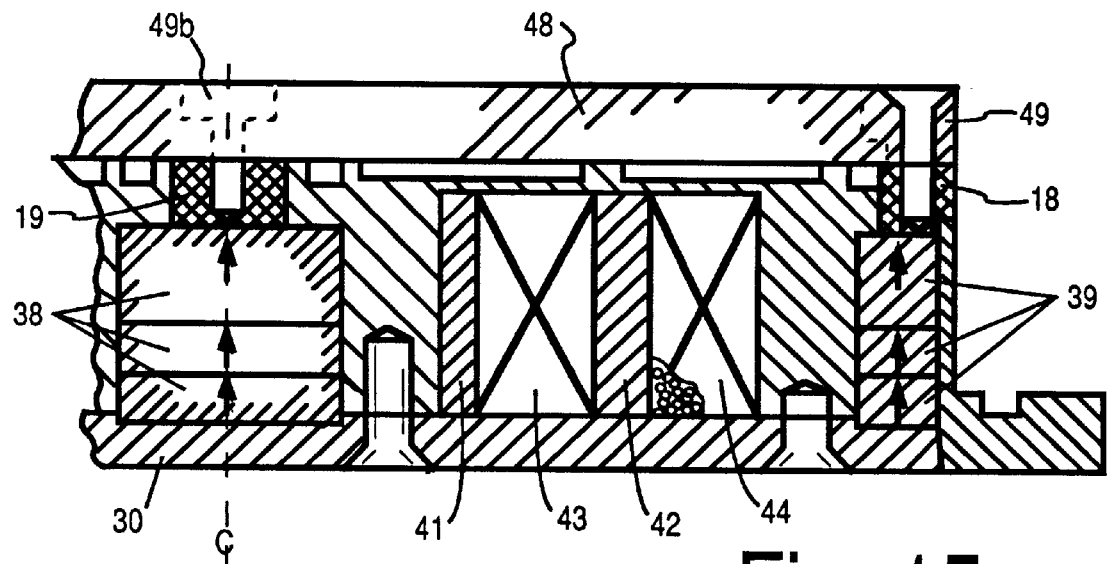
FIG. 15 is a partial cross-sectional illustration of an embodiment of the present invention, which is useful for sputtering relatively thin target materials.

FIG. 15 shows a cross-sectional illustration of an alternative embodiment of the present invention which is appropriate for relatively thin (0.25-inch or less) non-magnetic or magnetic target materials. As before, elements which correspond to those previously described are labeled with the same numerals. In this design small trim magnets 46 and 47 in FIG. 13 are eliminated, and coils 43 and 44 are larger. As in the previous example AC and/or DC signals are applied to coils 43 and 44 to broaden the sputtering grooves, and to control the sputtering rate of the inner groove with respect to the outer groove to obtain highly uniform coatings. Optional central clamp screw 49b prevents thin or weak targets from bowing or lifting up at their centers due to the pressure of the cooling water. Additionally, target clamp ring 49 (dashed) need not be a separate piece, but may be simply incorporated into a larger target which is drilled with the appropriate pattern of holes.

Relatively thick targets of magnetic material may be sputtered more efficiently if the cross-sectional shape of the target is modified from the simple flat geometry previously shown. A technique for the sputtering of thick magnetic targets is shown in the cross-sectional view of FIG. 16. Circular target 48 is modified to reduce the thickness near the center of the plate as indicated by region 64. The purpose is to maintain approximately the same erosion rate from the inner sputtering ring as obtained for non-magnetic targets, without incurring the requirement to increase the magnetic strength of the inner pole. The recessed thinner central region 64 should be larger in diameter than the inner sputtering groove (the eroded annulus 59 in FIG. 13), including its extent when oscillated by the AC drive field. As a rule of thumb it should extend approximately to inner annular pole piece 41. The shape of transition 64a to full target thickness, which is shown as sloped in the figure, is not critical. As an example, if the thickness of the original target plate is 0.375 inches, then thinned region 64 should be about half that thickness. If the magnetic permeability of the target material is known, the computer modeling code can predict a thickness for region 64 which will maintain the desired relationship between the magnetic field strengths at the inner and outer sputtering grooves.

Figure 16:
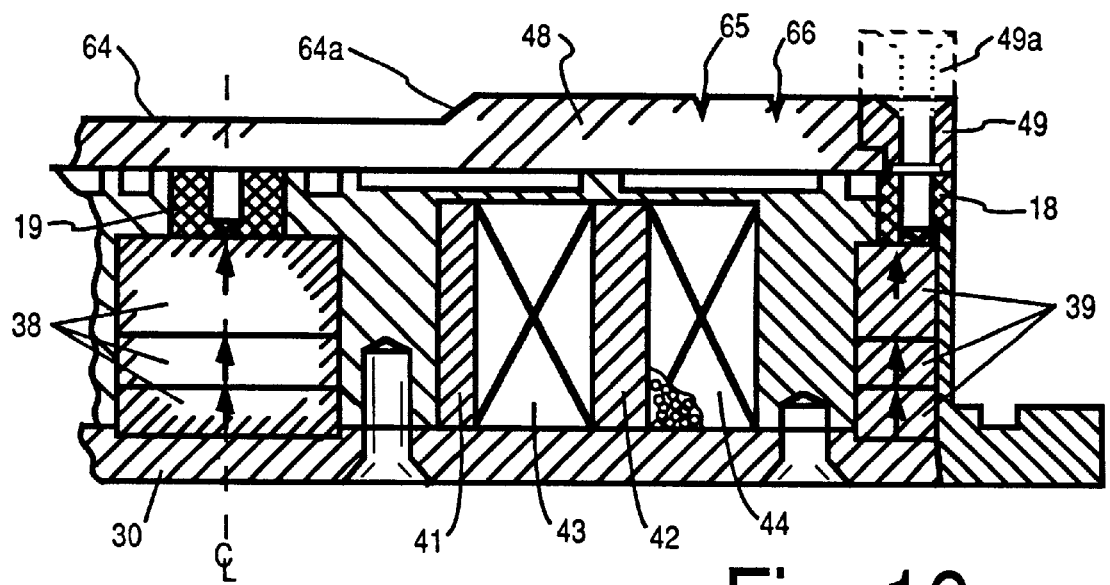
FIG. 16 is a cross-sectional diagram of an embodiment of the present invention, which is useful for sputtering relatively thick magnetic target materials.

There are two additional modifications that can improve the performance of the outer sputtering groove (the eroded outer annulus 58 in FIG. 13), and which may be used individually or together. First, annular notches or grooves 65 and 66 can be cut into the target at specific radial positions (diameters). In FIG. 16, the notches 65 and 66, are placed radially inside and outside of the trough of the normal sputtering groove (58 in FIG. 13) that would form if the target were sputtered without the AC drive field applied. Since the target is magnetically permeable, the notches create local magnetic flux leakage regions that effect the oscillation of the outer sputtering groove when the AC drive field is active. Additionally, the notches 65 and 66 may be of different widths and/or depths. It has been found experimentally that inner notch 65 should be deeper than outer notch 66. In addition to, or in place of the notches, target clamp ring 49, which is made of magnetically permeable material, may be extended as indicated by dashed element 49a to broaden the outer sputtering groove in a manner similar to that discussed earlier for a non-magnetic target.

Although the present invention has been described above in terms of certain specific embodiments, it is anticipated that many alterations and modifications will become apparent to those skilled in the art after having read this disclosure. It is therefore intended that the appended claims be interpreted broadly so as to include all such alterations and modifications as fall within the true spirit and scope of the invention.

What is claimed is:

1. An inverted circular planer magnetron sputtering device for depositing substantially uniform coatings on substrates, comprising:

a generally circular body having an axis of symmetry and having a target side and a back side, said target side having at least one shallow channel for flow of target coolant, said back side having formed therein a central cavity, an annular outer cavity, and an annular medial cavity disposed substantially midway between said central cavity and said outer cavity, said cavities being concentric with said axis of symmetry;

a circular target plate having a front surface and a back surface, said target plate being affixed to said body with said back surface facing said target side;

a plurality of permanent magnets respectively disposed within said central cavity and said outer cavity and respectively forming center and outer magnetic poles of like magnetic orientation with respect to said target plate;

at least one annular pole piece disposed within said medial cavity; and a magnetically permeable backing plate affixed to said body and covering said back side thereof, said backing plate combining with said one annular pole piece to provide flux closure paths for an inner magnetic circuit including the permanent magnets in said central cavity and an outer magnetic circuit including the permanent magnets in said outer cavity, whereby when sputtering power is applied to said device, a pair of concentric plasma sputtering rings are generated including an inner sputtering ring developed by said inner magnetic circuit and an outer sputtering ring developed by said outer magnetic circuit.

2. An inverted circular planer magnetron sputtering device as recited in claim 1 and further comprising a first electromagnetic winding disposed within said medial cavity and associated with said one annular pole piece, and a source of electrical power connected to said first electromagnetic winding such that when current is caused to flow through said first electromagnetic winding, a particular characteristic of at least one of said inner and outer sputtering rings will be altered.

3. An inverted circular planer magnetron sputtering device as recited in claim 2 wherein when power applied by said source to said first electromagnetic winding has an alternating current component, said particular characteristic includes oscillation about a steady state position.

4. An inverted circular planer magnetron sputtering device as recited in claim 3 and further comprising a second annular pole piece and a second electromagnetic winding disposed within said medial cavity and associated with said second annular pole piece, said second electromagnetic winding being adapted for connection to an electrical power supply such that when current is caused to flow through said second electromagnetic winding, at least one additional characteristic of at least one of said inner and outer sputtering rings is altered.

5. An inverted circular planer magnetron sputtering device as recited in claim 4 wherein the power applied to at least one of said second electromagnetic windings has an alternating current component and causes at least one of said inner and outer sputtering rings to be oscillated about its nominal position caused by the permanent magnets alone.

6. An inverted circular planer magnetron sputtering device as recited in claim 5 wherein at least one of said second electromagnetic windings has a selectively variable DC current component applied thereto by said power source, said DC component allowing control of a ratio of target erosion rates caused by said inner sputtering ring and said outer sputtering ring.

7. An inverted circular planer magnetron sputtering device as recited in claim 5 wherein at least one of said second electromagnetic windings has a selectively variable DC current component applied thereto by said power source, said DC component allowing real time control of a ratio of target erosion rates caused by said inner sputtering ring and said outer sputtering ring.

8. An inverted circular planer magnetron sputtering device as recited in claim 2 and further comprising a second annular pole piece disposed within said medial cavity radially outside of said one annular pole piece, said second annular pole piece also combining with said backing plate to provide a flux closure path for at least one of said inner and outer magnetic circuits.

9. An inverted circular planer magnetron sputtering device as recited in claim 8 and further comprising a second electromagnetic winding disposed within said medial cavity and associated with said second annular pole piece, said second electromagnetic winding being adapted for connection to an electrical power supply such that when current is caused to flow through said second electromagnetic winding, at least one characteristic of at least one of said inner and outer sputtering rings is altered.

10. An inverted circular planer magnetron sputtering device as recited in claim 9 wherein said plurality of permanent magnets include a first plurality of permanent magnets stacked within said central cavity and a second plurality of permanent magnets stacked within said outer cavity.

11. An inverted circular planer magnetron sputtering device as recited in claim 8 and further comprising:

a central disk affixed to said body, disposed above said central cavity, and forming a center pole piece; and an outer annular ring affixed to said body, disposed above said outer cavity, and forming an outer pole piece.

12. An inverted circular planer magnetron sputtering device as recited in claim 11 wherein said center pole piece and said outer pole piece form means to which said target plate is secured.

13. An inverted circular planer magnetron sputtering device as recited in claim 1 wherein entry and outlet ports are provided for communicating coolant to a coolant passageway formed at least in part by said shallow channel.

14. An inverted circular planer magnetron sputtering device as recited in claim 13 wherein said back surface of said target plate combines with said shallow channel to form said coolant passageway.

15. An inverted circular planer magnetron sputtering device as recited in claim 13 and further comprising a thin metallic membrane affixed to said body and covering said shallow channel to form a coolant passageway, said membrane being adapted to engage said back surface of said target plate to transfer heat from said target plate to said coolant.

16. An inverted circular planer magnetron sputtering device as recited in claim 1 wherein said target side has at least two shallow coolant channels formed therein including an inner circular channel disposed above said medial cavity and an outer circular channel disposed above said outer cavity.

17. An inverted circular planer magnetron sputtering device as recited in claim 1 and further comprising:

a central disk affixed to said body, disposed above said central cavity, and forming a center pole piece; and an outer annular ring affixed to said body, disposed above said outer cavity and forming an outer pole piece.

18. An inverted circular planer magnetron sputtering device as recited in claim 17 wherein said center pole piece and said outer pole piece form means to which said target plate is secured.

19. An inverted circular planer magnetron sputtering device as recited in claim 17 and further comprising:

an annular member including a first portion forming a circular mounting flange and a second portion forming a cylindrical outer wall circumscribing said body, said center pole piece, said outer pole piece and said outer wall being welded to said body to form a rigid unit.

20. An inverted circular planer magnetron sputtering device as recited in claim 1 wherein said plurality of magnets include a first plurality of permanent magnets stacked within said central cavity and a second plurality of magnets stacked within said outer cavity.

21. An inverted circular planer magnetron sputtering device as recited in claim 1 wherein said inner sputtering ring and said outer sputtering ring are magnetically decoupled from each other.

22. An inverted circular planer magnetron sputtering device as recited in claim 1, wherein said at least one annular pole piece is constructed from nickel plated mild steel.

23. An inverted circular planer magnetron sputtering device as recited in claim 1, wherein said body has a primary annular structure in which said at least one shallow channel is formed, said at least one shallow channel having coolant entrance and exit holes, said backing plate having holes aligned with said coolant entrance and exit holes, the inverted circular planer magnetron sputtering device being configured for direct cooling.

24. An inverted circular planer magnetron sputtering device as recited in claim 1, and further comprising a circular membrane placed over said shallow channels to transfer heat from said circular target plate and provide indirect cooling.

25. An inverted circular planer magnetron sputtering device as recited in claim 24, wherein said circular membrane is composed of a heat conducting material including material selected from a group consisting of copper, beryllium copper and nickel.

26. An inverted circular planer magnetron sputtering device as recited in claim 1, and further comprising at least one permanent magnet for magnetic field structure fine tuning, said at least one annular polar piece being positioned atop said at least one permanent magnet.

* * * * *